United States Patent

Davidson et al.

[15] 3,699,722

[45] Oct. 24, 1972

[54] PRECISION POLISHING OF SEMICONDUCTOR CRYSTAL WAFERS

[72] Inventors: Jimmy L. Davidson, Melbourne Beach; George V. Rouse, Melbourne, both of Fla.

[73] Assignee: Radiation Incorporated, Melbourne, Fla.

[22] Filed: Nov. 23, 1970

[21] Appl. No.: 92,072

[52] U.S. Cl. .......................................51/283, 51/131
[51] Int. Cl. .............................................B24b 37/04
[58] Field of Search................................51/131, 283

[56] References Cited

UNITED STATES PATENTS

| | | | |
|---|---|---|---|
| 3,110,988 | 11/1963 | Boettcher | 51/131 |
| 2,998,680 | 9/1961 | Lipkins | 51/131 |
| 2,839,877 | 6/1958 | Boettcher | 51/131 |
| 2,979,868 | 4/1961 | Emeis | 51/131 |
| 2,883,803 | 4/1959 | Stead | 51/131 |
| 3,453,783 | 7/1969 | Queen | 51/131 X |
| 2,618,911 | 11/1952 | Irdge | 51/131 UX |

*Primary Examiner*—Harold D. Whitehead
*Attorney*—Donald R. Greene

[57] ABSTRACT

A method of polishing semiconductor crystal wafers in which a planar array of wafers is rotated about an axis normal to its plane while rotating a polishing surface in contact with a face of each wafer of the array in the same sense as the sense of rotation of the array, about an axis displaced from and parallel to the axis of rotation of the array. The wafer is displaced from the polishing surface at locations closest and furthest from the axis of rotation to eliminate the extremes of rotational velocity.

3 Claims, 4 Drawing Figures

INVENTORS
JIMMY L. DAVIDSON
GEORGE V. ROUSE
BY Donald R. Greene
ATTORNEY

PRECISION POLISHING OF SEMICONDUCTOR CRYSTAL WAFERS

BACKGROUND

1. Field of the Invention:

The present invention relates generally to processes for polishing thin flat plates with precise dimensional control, and has particular application to precision polishing of thin semiconductor crystal slices or wafers.

2. Discussion of Prior Art

Semiconductor crystals, such as silicon, are commonly grown by a technique known as "pulling," developed by Czochraliski, or by a zone melting process. In the Czochraliski method, for example, a seed crystal is lowered into molten silicon and is slowly withdrawn (i.e., pulled) from the melt to provide a large cylindrical single crystal ingot. The cylindrical crystal is then sawed into circular slices or wafers on the order of 15 to 20 mils thick, using a diamond impregnated saw. Typically, the wafers are thereafter lapped with silicon carbide abrasive. Surface preparation of the wafers usually includes polishing with an extremely fine grit abrasive to remove grinding damage on the major wafer surfaces, and to obtain a final disk with near optical flatness of major surfaces and of uniform thickness throughout, suitable for further processing such as etching, diffusion, deposition, and so forth.

Unfortunately, however, prior art polishing techniques have been relatively unsuccessful in producing wafers of uniform thickness or of desired planarity. Instead, an undesirable taper is generally formed in each wafer as a result of imperfections in the polishing apparatus and process, rendering a relatively large portion of the wafer, or perhaps the entire wafer, unacceptable for further processing to fabricate discrete semiconductor devices and/or integrated circuits therein.

In a polishing process commonly utilized in the past, the slices are mounted, usually by a thin layer of wax, on the face of a rotatable circular block (wafer holder) confronting a larger diameter rotatable wheel on which a polishing pad is mounted. The axes of rotation of the wafer holder and the polishing wheel are displaced from, but parallel to one another, and are aligned along a radial line of the wheel with the wafer holder entirely confined between the center and outer periphery of the wheel. The polishing wheel and the wafer holder are rotated in opposite senses as the wafers and the polishing pad are brought together under pressure.

It has been observed in the use of this apparatus that the greater the diameter of a wafer, the more pronounced is the waste. Thus, it has been found that the polishing to which a 1⅜inch diameter wafer is subjected and which provides marginal acceptability, is totally unsatisfactory in two-inch slices. In fact, unacceptable taper occurs in 2-inch wafers before removal of even half the grinding-damaged silicon surface.

The production of a wafer with damage-free planar faces and uniform thickness (i.e., parallel faces) is absolutely essential to the fabrication of semiconductor devices therein with reasonable yield. For example, in a process described in copending application Ser. No. 374,132 entitled "Solid State Integrated Circuits," filed June 10, 1964 in the names of U.S. Davidsohn et al., of common assignee, the silicon wafer is grooved in a waffle-like pattern, the waffle surface passivated with an oxide layer which is then covered with polycrystalline silicon, and the wafer then flipped and lapped back to expose discrete single crystal silicon islands dielectrically isolated from the polycrystalline substrate. Absence of parallelism of major faces of the slice within reasonable tolerances will result in islands of varying depth. Since discrete integrated circuit devices are to be fabricated in these islands by conventional processing techniques, the variation in island depth will render unacceptable for some islands the same process tolerances which are acceptable for other islands. For example, etching and impurity diffusion to prescribed depths will result in differing layer thicknesses for the same components fabricated in different islands.

SUMMARY OF THE INVENTION:

The present invention is attributable to a recognition that there exists a wide variation in relative velocities between the polishing block (wafer holder) and the polishing wheel of the prior art apparatus, and that since each wafer is subjected to this change in relative velocities during each polishing cycle, the wide variation must be reduced if precise removal of uniform layers from each wafer is to be achieved.

In the particular case where the wafer holder is positioned wholly between the center and the outer periphery of the polishing wheel, and in a plane parallel to the plane of the wheel, the velocity of any given point along the outer edge of the holder relative to the outer periphery of the wheel is greater when holder and wheel rotate in opposite directions (i.e., opposite senses) than when they rotate in the same direction. The tangential velocity of any portion of the wheel is directly related to its distance from the axis of rotation (i.e., the center of the wheel) this velocity increasing with increasing radial distance from the center. Hence, the velocity of a given point along the edge of the holder relative to the portion of the wheel adjacent which it passes nearest the center of the wheel, when holder and wheel are moving in the same sense, is substantially less then the velocity of that point relative to the outer periphery of the wheel adjacent which it passes, when block and wheel are moving in opposite senses, other things being equal. It is to be observed that this reduction in relative velocity occurs despite the fact that the instantaneous motion of the given point is in a direction opposite the movement of the adjacent portion of the wheel in either case.

According to one aspect of the present invention, then, the wafer holder is rotated in the same sense (either clockwise or counter-clockwise) as is the polishing wheel, to maintain the velocities of the wafers mounted on the block relative to the immediately adjacent respect portions of the wheel within narrow limits (i.e., to make the velocity distribution more uniform).

According to another aspect of the invention, the active polishing area of the apparatus is decreased in a manner to eliminate polishing action at the two extremes of relative rotational velocity between holder and wheel. This leads to still further smoothing of the velocity distribution over the entire surface of the holder relative to adjacent portions of the confronting surface of the wheel. In a preferred embodiment, this second aspect of the invention is implemented by controlled shaping of the active polishing area on the wheel. In particular, the polishing pad is brought into abutment with the mounted wafers along a swath which is less than the diameter of the holder and which falls within the limits of excursion of any wafer at the extreme radial positions relative to the axis of rotation of the wheel. In addition to the improved velocity distribution, those segments of each wafer furthest from the center of the holder (and therefore moving closest to the outer periphery of the wheel in each cycle than any other segments) are subjected to less actual polishing time, which tends to compensate fro an increase in polishing rate near the outer periphery.

BRIEF DESCRIPTION OF THE DRAWINGS:

In describing the invention in detail, reference will be made to the accompanying figures of drawing, in which.

DESCRIPTION OF THE PREFERRED EMBODIMENT

Figure 1:
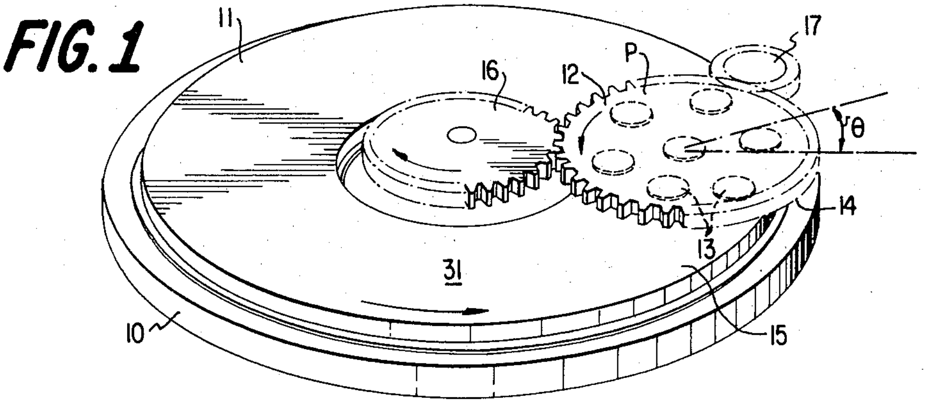
FIG. 1 is a simplified perspective view of the polishing apparatus showing the improved operating relationships of the various components according to the present invention.

The basic mechanism of a standard planetary polishing system essential to an understanding of the present invention is shown in FIG. 1. A large diameter wheel 10 on which a suitable polishing pad 11 is mounted undergoes rotation in a preselected sense. In FIG. 1 the rotation is indicated as being in a counter-clockwise sense, but as will be apparent from the ensuing description a clockwise rotation is permissible, the particular sense of rotation being immaterial to the practice of the invention subject to certain limitations to be described.

A cylindrical block 12 of smaller diameter than wheel 10 is held in operative relation to the wheel. The block is entirely confined for rotation between the center and outer periphery of wheel 10. A plurality of semiconductor wafers 13 to be polished are mounted on the face 14 of block 12 confronting the face 15 of wheel 10 on which polishing pad 11 is mounted. While any convenient mounting method may be used, the wafers 13 are typically mounted to the block 12 by a thin layer of wax. For obvious reasons, block 12 is hereinafter sometimes referred to as a wafer holder or slice holder.

Each of wheel 10 and holder 12 is mounted for rotation about an axis parallel to, but displaced from, the axis of the other. The wafer holder 12 is part of a planetary gear system in which a driving spindle 16 having an axis common to the axis of wheel 10 rotates the holder relative to the wheel on a freely rotatable idler spindle 17. Wheel 10, however, is driven independently of the driving spindle 16; that is to say, the two are rotatable relative to one another.

Wafer holder 12 and wheel 10 are arranged for axial movement relative to one another, for selective removal of the holder from the apparatus to permit mounting of the semiconductor wafers 13. When the holder 12 is returned to its position with the mounted wafers thereon, the capability of relative axial movement with the wheel permits precise adjustment and maintenance of desired pressure on the exposed major faces of the wafers as these surfaces are abutted against the polishing pad 11 on wheel 10.

Typically, seven 1⅜inch wafers are mounted on holder 12 in the configuration or array shown in FIG. 1, one of the wafers being centrally located and the others being spaced equiangularly at 60° intervals on a circle of common centers. Five 2-inch or larger wafers may alternatively be mounted in the equiangular configuration. The polishing pad is of standard construction, with pads sold under the trade names "Corfam," "Pellon," and "Politex Supreme" being suitable, and the latter preferred. The pad is saturated with a polishing compound such as $ZrO_2$ *or* $Al_2O_3$ powder of mean particle diameter ranging from one to two microns in a suitable binder.

The equipment and arrangement thus far described is perfectly standard. Contrary to the teachings of the prior art, however, and according to the present invention, the apparatus is modified to rotate the wafer holder 12 in the same sense as the wheel 10 is rotated. Thus, for example, the driving spindle 16 rotates wafer holder 12 in the counter-clockwise direction as shown in FIG. 1 the same direction of rotation as wheel 10. Because the axis of rotation of holder 12 is displaced from the axis of wheel 10 along a radius of the wheel, a point P near the edge of the holder furthest from the axis of the wheel will undergo movement in the same direction as the adjacent segment of the wheel, whereas the same point will move in the direction opposite to the underlying wheel segment when the edge of the holder is nearest the axis of the wheel (i.e., during further rotation of the holder). At points midway between these two extremes, the point P is traveling laterally with respect to the direction of movement of the immediately adjacent section of the wheel.

Since the tangential velocity of any point on the wheel is directly related to its distance from the axis of rotation of the wheel, the wafers 13 are experiencing movement in the same direction as the polishing pad 11 where the abutting portions of the pad are at near maximum tangential velocity, and in the direction opposite that of the pad where the tangential velocity of the abutting portions is near minimum, for any given angular velocity of the wheel. Hence, the relative velocities of the wafer faces and the abutting polishing pad are within a narrow range when compared to the wide range of relative velocities encountered using the opposing rotational senses taught in the prior art. That is to say, the present invention achieves substantially greater uniformity of distribution of relative velocities between wafer faces and polishing pad.

Figure 2:
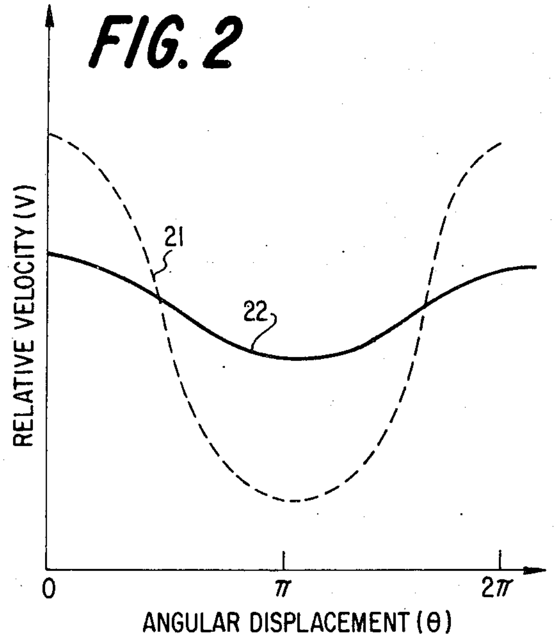
FIG. 2 is a velocity distribution graph indicating a comparison of the old polishing method with the method of the present invention.

The comparison is graphically illustrated in FIG. 2. The ordinate of the graph is the velocity of the wafer holder relative to the wheel, and the abscissa is the angular displacement from the radial line of the wheel containing the axis of rotation of the holder of the point on the holder whose velocity relative to the wheel is being observed. The dotted curve 21 was plotted for rotation of wheel and holder in opposite senses. and the solid curve 22 was plotted for rotation of wheel and holder in the same sense. The curves are approximate, and slightly exaggerated because it is relative velocity that is charted. The wheel was rotated at a greater angular velocity than the holder to obtain the measurements for the graph of FIG. 2, although that is not essential to achieve the more uniform velocity distribution taught herein.

As a result of this narrow range of relative velocities between the wafer holder 12 and the wheel 10 the polishing of the wafer faces reaches a precision not heretofore achieved in that the amount of material removed from the wafer faces in any given duration of operation is virtually uniform over an entire face, irrespective of the particular position of the wafer in the mounting configuration on the holder. Yet, even closer tolerances may be achieved in accordance with the second aspect of the invention, which effectively subjects those portions of the wafer faces undergoing movement in the extremities of the relative velocity range to a lower duration of actual polishing than the remaining portions, during each cycle of rotation. To that end, the polishing pad 11 is constructed and arranged to make contact with the wafers 13 only along a swath across the confronting face of the wafer holder 12 which excludes the wafer segments in the two extremes of relative velocity.

Figure 3:
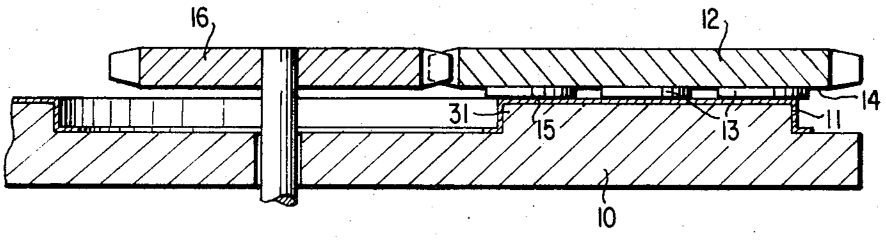
FIG. 3 is a section view taken through wheel, pad and holder of the apparatus of FIG. 1.

With reference again to FIG. 1 and concurrently to FIG. 3, it will be observed that the polishing apparatus of the present invention is provided with an annular raised region 31 on the face of wheel 10 confronting holder 12. In practice, annulus 31 is readily provided by appropriately machining the wheel itself, although it may alternatively be a separate piece of rigid material which is fastened to the wheel. Polishing pad 11, which is also cut in an annular shape, is mounted on ridge 31 and when brought into contact with the wafers 13 exposes a segment of up to about two-thirds of any wafer positioned along the radial line containing the axes of rotation of both wheel and holder. Naturally, when the wafer is positioned at any given instant on either side of this radial line a proportionately smaller segment is exposed, i.e., is out of contact with the polishing pad. As the wafer hold and the wheel rotate relative to one another, then, only the centrally mounted wafer is continuously in contact with the polishing pad. Each of the other wafers bears against the pad over its entire face only during the two portions of each cycle when it is moving between the inner and outer raised edges of the pad. As the holder 12 continues to rotate, a wafer which has moved entirely across the moving pad begins to become exposed and reaches maximum exposure when positioned such that its center is aligned with the axes of rotation of the holder and the wheel. Thereafter, the magnitude of exposure diminished until the wafer is again entirely in a portion of its path between the inner and outer raised edges of the pad.

Figure 4:
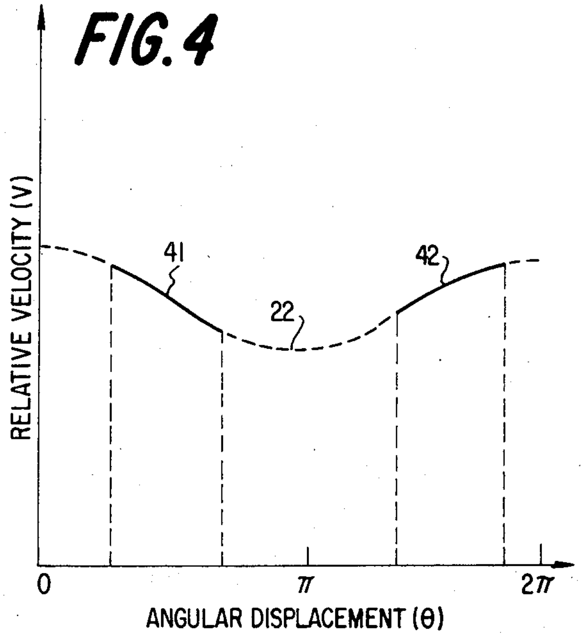
FIG. 4 is a velocity distribution graph with modification of the polishing timing during each cycle.

This operation achieves the desired effect of additionally smoothing the velocity distribution curve by clipping the curve at both extremes of the relative velocity distribution, as shown in FIG. 4 where the solid lines 41, 42, indicate the active polishing portions of each cycle relative to the dotted line conforming to curve 22 in FIG. 2. The extent of this "clipping" is a function of the amount of each wafer which becomes exposed during two portions of each cycle, and the latter is in turn a function of the annular width of the polishing pad 11.

In a practical embodiment of the invention, the wafer holder 12 had a diameter of 4⅞inches, and the polishing pad 11 had a width of 3⅜inches with inner and outer edges approximately equidistant from the extremities of the holder edge along the radial line containing the axes of rotation of wheel and holder. For seven 1⅜inch wafers mounted in the configuration shown in FIG. 1, the maximum exposure of each wafer was about nine-sixteenths inch of diameter. The angular velocities of the wheel and holder were $175\pi$ radians per minute and 100$\pi$ radians per minute, respectively.

It has been found that from about 0.6 to about 0.7 mils of surface silicon may be removed from each face of a 2-inch diameter silicon wafer of approximately 15 mils thickness using the method described above, while generating less than 0.1 mil thickness variation and less than 0.1 mil flatness deviation and providing a smooth surface finish. This is an order of magnitude better than could heretofore be achieved with known techniques.

It will be apparent that the method which has been described is applicable to precision polishing of discs or pieces other than semiconductor crystal slices. Accordingly, the present invention should not be taken as limited to the structure, methods, and/or applications which have been shown or described herein, except as such limitations are imposed by the appended claims.

We claim:

1. A method of polishing semiconductor wafers, which comprises rotating a plurality of wafers mounted in a symmetrical array in a common plane about the axis of symmetry of said array, independently rotating an annular polisher in the same rotational sense about the axis thereof displaced from and parallel to the axis of rotation of said wafer array, moving the wafer array and a parallel plane polishing surface of said annular polisher having a width substantially less than the lineal extent of said wafer array relative to one another to produce contact between said plane surface and a face of each of said wafers, for continuously polishing each said wafer face as the wafer array and the plane surface undergo relative rotation except along a substantial area of each said wafer face which becomes displaced from said plane surface during the two portions of each cycle of rotation of said wafer array when the respective wafer lies along the line intersecting both of said axes of rotation in the locations closest to and furthest from the axis of rotation of the annular polisher, to eliminate polishing of the wafers at the two extremes of relative rotational velocity of said wafer array and said plane surface and thereby to obtain more uniform polishing of each wafer face.

2. The method of claim 1, wherein the wafer array and the plane polishing surface are rotated at different angular velocities.

3. A process for polishing the main faces of semiconductor wafers to a smooth flat finish, which comprises mounting a plurality of said wafers in an array on a common circle of centers on the planar surface of a flat holder so that the faces of said wafers to be polished lie in a substantially common plane to the extent possible with deviations in thickness and flatness of the mounted wafers, disposing the faces of said wafers to be polished in confronting relationship to the planar surface of an annular polisher disposed parallel to said planar surface of said holder, with the extremities of the wafer array extending substantially beyond the inner and outer edges of the narrower planar surface of said polisher, and rotating said holder and said polisher in the same sense about the axis of the wafer array and the axis of the annulus, respectively, said axes being parallel and displaced by a distance greater than the distance from the center of the wafer array to the outer edge of any wafer thereof, while maintaining said faces of said wafers to be polished under pressure against said planar surface of said polisher, to continuously polish the face of each wafer except that portion of the wafer face which lies beyond the planar surface of the polisher during each excursion of the respective wafer to the nearest and furthest positions relative to said axis of the annulus along the line intersecting both of said axes.

* * * * *